(12) United States Patent
Ichimiya et al.

(10) Patent No.: US 8,327,212 B2
(45) Date of Patent: Dec. 4, 2012

(54) ERROR IDENTIFYING METHOD, DATA PROCESSING DEVICE, AND SEMICONDUCTOR DEVICE

(75) Inventors: Junji Ichimiya, Kawasaki (JP); Hiroshi Nakayama, Kawasaki (JP); Shintarou Itozawa, Kwasaki (JP)

(73) Assignee: Fujitsu Limited, Kawasaki (JP)

( * ) Notice: Subject to any disclaimer, the term of this patent is extended or adjusted under 35 U.S.C. 154(b) by 709 days.

(21) Appl. No.: 12/396,106

(22) Filed: Mar. 2, 2009

(65) Prior Publication Data

US 2009/0300452 A1 Dec. 3, 2009

(30) Foreign Application Priority Data

May 29, 2008 (JP) ................. 2008-140222

(51) Int. Cl.
- *G01R 31/28* (2006.01)
- *G08C 25/02* (2006.01)
- *H04L 1/18* (2006.01)
- *G06F 7/02* (2006.01)
- *G06F 11/00* (2006.01)
- *G08C 15/00* (2006.01)
- *H04J 1/16* (2006.01)
- *H04J 3/14* (2006.01)
- *H04L 1/00* (2006.01)
- *H04L 12/26* (2006.01)

(52) U.S. Cl. ........ 714/748; 714/712; 714/821; 370/242; 375/224; 375/226

(58) Field of Classification Search .................... None
See application file for complete search history.

(56) References Cited

U.S. PATENT DOCUMENTS

| | | | | |
|---|---|---|---|---|
| 4,292,465 | A * | 9/1981 | Wilson et al. | 178/3 |
| 4,750,177 | A * | 6/1988 | Hendrie et al. | 714/748 |
| 5,339,408 | A * | 8/1994 | Bruckert et al. | 714/11 |
| 6,938,195 | B1 | 8/2005 | Shi et al. | |
| 7,694,204 | B2 * | 4/2010 | Schmidt et al. | 714/758 |
| 7,843,830 | B1 * | 11/2010 | Subramanian et al. | 370/235 |
| 2004/0221025 | A1 * | 11/2004 | Johnson et al. | 709/223 |
| 2005/0240811 | A1 * | 10/2005 | Safford et al. | 714/11 |
| 2007/0260965 | A1 * | 11/2007 | Schmidt et al. | 714/799 |
| 2009/0003413 | A1 * | 1/2009 | Jang et al. | 375/135 |
| 2010/0180170 | A1 * | 7/2010 | Seo et al. | 714/748 |
| 2011/0131370 | A1 * | 6/2011 | Vogt et al. | 711/105 |

FOREIGN PATENT DOCUMENTS

| | | |
|---|---|---|
| JP | 63-2442 A | 1/1988 |
| JP | 11-149422 A | 6/1999 |
| JP | 2000-349742 | 12/2000 |
| JP | 2003-188858 | 7/2003 |
| JP | 2005-70822 A | 3/2005 |
| JP | 2009-130923 A | 6/2009 |

OTHER PUBLICATIONS

Japanese Office Action mailed Aug. 7, 2012 for corresponding Japanese Application No. 2008-140222, with English-language Translation.

* cited by examiner

*Primary Examiner* — Guerrier Merant
(74) *Attorney, Agent, or Firm* — Fujitsu Patent Center

(57) ABSTRACT

A data processing device which performs a data transmission between semiconductor devices using a plurality of signal lines. In the data processing device, when there occurs an error in a data transmission from a transmitting device to a receiving device using a plurality of signal lines, data in which the error has occurred is stored. The stored data is compared bit by bit with non-erroneous data, thereby designating a bit in which error has occurred in the stored data.

11 Claims, 10 Drawing Sheets

| STORED DATA IN AN ERROR BUS | 1 | 0 | 1 | 0 | 1 | 0 | 1 |
|---|---|---|---|---|---|---|---|

| | | a | b | | | | |
|---|---|---|---|---|---|---|---|
| DETERMINATION RESULT | ○ | × | × | ○ | ○ | ○ | ○ |

| NORMAL DATA | 1 | 1 | 0 | 0 | 1 | 0 | 1 |
|---|---|---|---|---|---|---|---|

ERROR IDENTIFYING METHOD, DATA PROCESSING DEVICE, AND SEMICONDUCTOR DEVICE

CROSS-REFERENCE TO RELATED APPLICATION

This application is based upon and claims the benefit of priority of the prior Japanese Patent Application No. 2008-140222, filed on May 29, 2008, the entire contents of which are incorporated herein by reference.

FIELD

The present invention relates to the technology of countering a transmission error occurring when a data transmission is performed.

BACKGROUND

In a computer, there are some points where a data transmission is performed using a plurality of signal lines between semiconductor devices such as an LSI etc.

Figure 1:
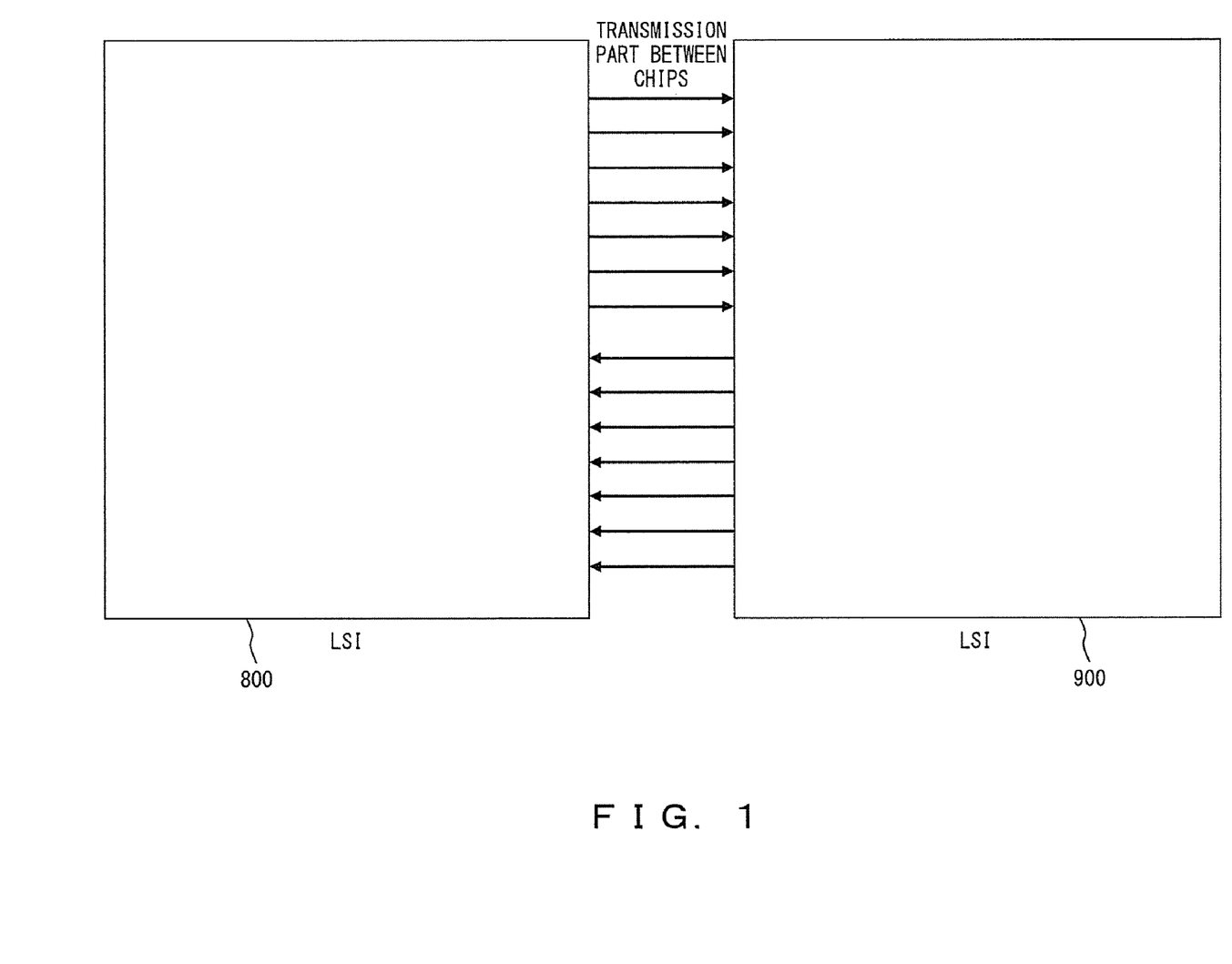
FIG. 1 is an explanatory view of a data transmission between conventional semiconductor devices.

FIG. 1 is an explanatory view illustrating the data transmission between conventional semiconductor devices.

A semiconductor device 800 transmits data to a semiconductor device 900 through a transmission unit. The transmission unit is provided with a plurality of buses (signal lines), and data is transmitted from the semiconductor device 800 to the semiconductor device 900 using the plurality of buses.

The semiconductor device 900 confirms using the received data whether or not a transmission error has occurred in the data. If the semiconductor device 900 confirms an occurrence of a transmission error, it requests the semiconductor device 800 to retransmit the data, and ignores (discards) subsequent requests (packets). In response to the retransmission request from the semiconductor device 900, the semiconductor device 800 retransmits the data to the semiconductor device 900 through a transmission unit.

Figure 2:
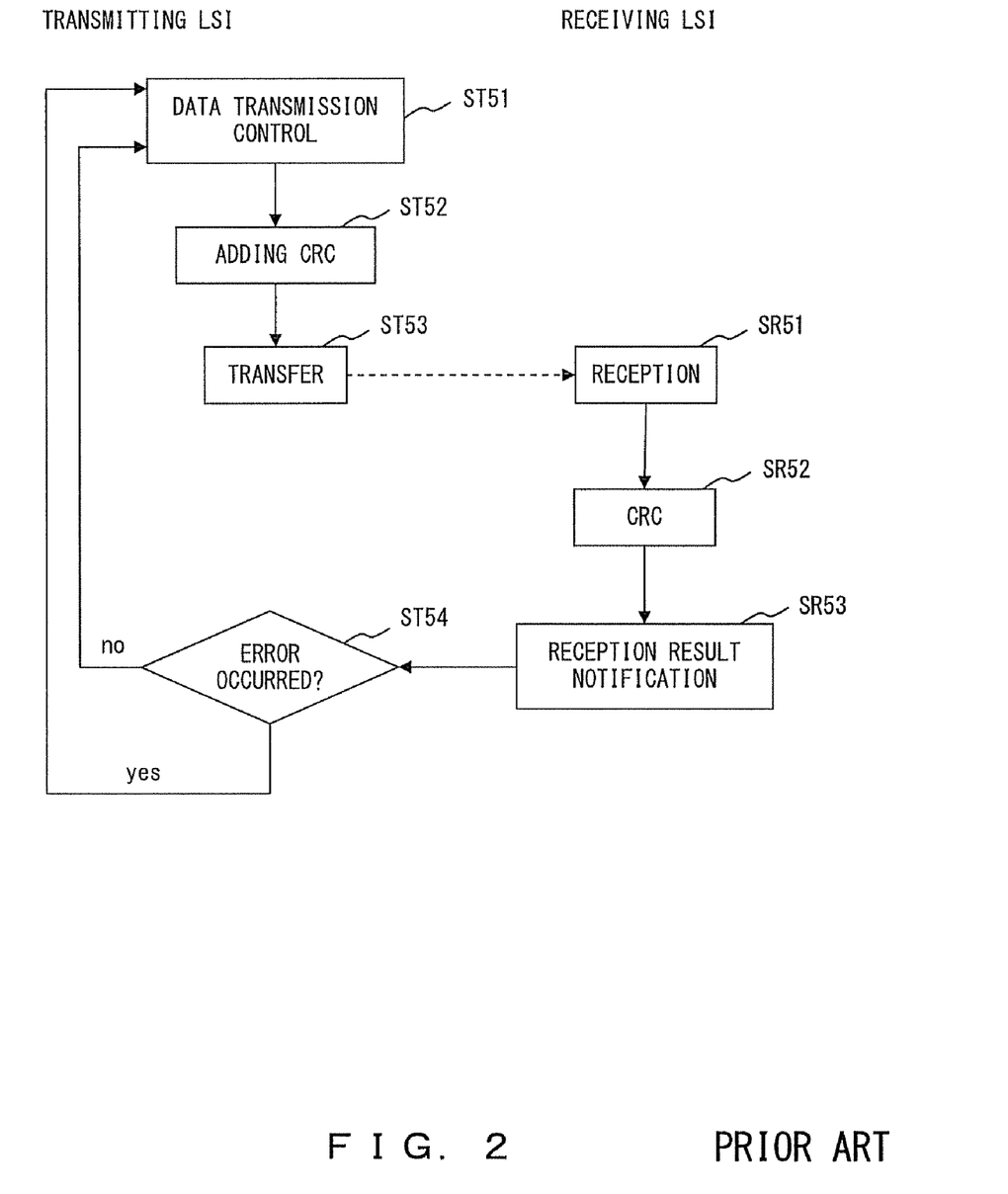
FIG. 2 is a flowchart illustrating the flow of the process of realizing a data transmission between the conventional semiconductor devices.

FIG. 2 is a flowchart illustrating the flow of the process of realizing a data transmission between conventional semiconductor devices. FIG. 2 illustrates the processes performed in the transmitting semiconductor device ("transmitting LSI" in FIG. 2) and the receiving semiconductor device ("receiving LSI" in FIG. 2).

The transmitting device executes the data transmission control (ST51), adds a check code in the CRC system to the data to be transmitted (ST52), and transfers the data (ST53).

On the other side, the receiving device receives the transferred data (SR51), performs an error check by the CRC (SR52), and notifies the transmitting device of the check result as a reception result (SR53).

Upon receipt of the reception result notification, the transmitting device decodes the notified reception result, and determines whether or not a transmission error has occurred (ST54). If a transmission error has occurred in the receiving device (YES in ST54), the data having a transmission error is selected during control of the data transmission (ST51). If no transmission error has occurred (NO in ST54), the data to be next transmitted is selected in the data transmission control (ST51).

Thus, the conventional semiconductor device simply requests a retransmission of data when a transmission error has occurred in the received data.

Recently, the data transmission speed of a computer has been greatly enhanced between semiconductor devices such as LSIs etc. A high-speed data transmission greatly serves in realizing higher data processing capacity. However, a higher data transmission speed causes errors more frequently in the data transmission through a bus. The occurrences of the errors interfere with high-speed data processing. Thus, it is considered that obtaining more pieces of information to counter errors occurring during the data transmission through a bus is very important hereafter.

Reference documents can be Japanese Published Patent Application No. 2003-188858 and Japanese Published Patent Application No. 2000-349742.

SUMMARY

When an error occurs during the data transmission performed using a plurality of signal lines from a transmitting device to a receiving device, the system according to an aspect of the present invention counters the error in a storing step of storing the erroneous data, and an error designating step of designating an erroneous bit in the stored data by comparing bit by bit the data stored in the storing step with non-erroneous data.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF THE DRAWINGS

FIG. 9 is an explanatory view of the method of retransmitting data when an error occurs.

DESCRIPTION OF EMBODIMENTS

An embodiment of the present invention are described below in detail with reference to the attached drawings.

Figure 3:
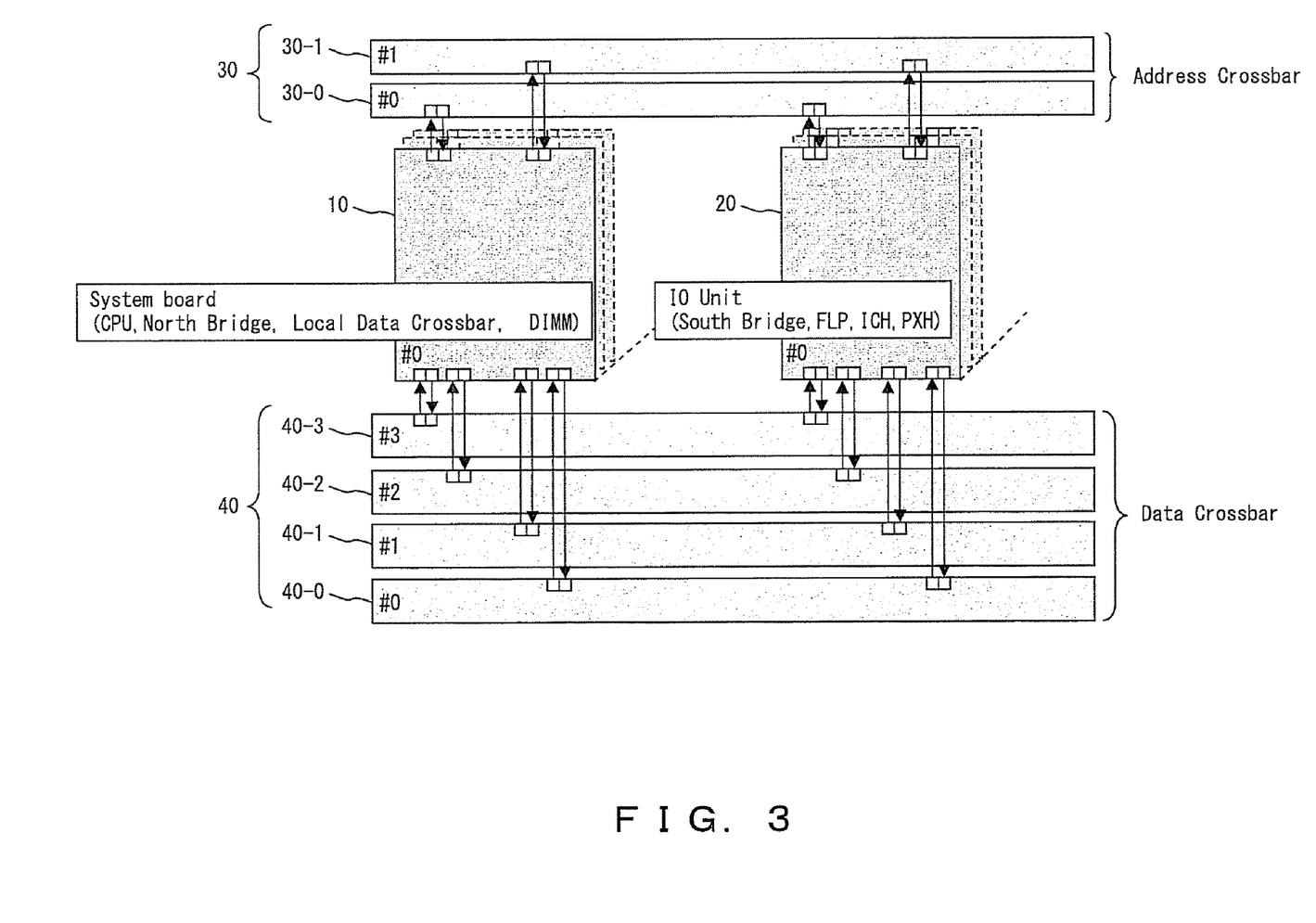
FIG. 3 is an explanatory view of the configuration of the data processing device according to an embodiment of the invention.

FIG. 3 is an explanatory view of the configuration of a data processing device (computer) according to an embodiment of the invention. As illustrated in FIG. 3, in the data processing device according to the present embodiment, one or more system boards 10 and IO units 20 are connected to two address crossbars 30-0 and 30-1 and four data crossbars 40-0, 40-1, 40-2, and 40-3. The system board 10 is a data processing unit and is loaded with a CPU, memory, etc. The IO unit 20 is a unit for inputting and outputting data, and is loaded with various controllers for connection with storage devices such as a hard disk device etc., and external devices etc. An address crossbar is assigned a reference numeral 30 when it refers to two or one of the two units. Similarly, a data crossbar is assigned a reference numeral 40 when it refers to four or one of the four units.

An address crossbar 30 is duplexed, and the two address crossbars 30-0 and 30-1 simultaneously control the same request, thereby realizing high reliability. Four data crossbars 40 are normally prepared to simultaneously transfer a large amount of data by a data processing device. Two address crossbars 30-0 and 30-1 synchronously operate. In the data crossbars 40, the two data crossbars 40-0 and 40-2 synchronously operate, and the two data crossbars 40-1 and 40-3 synchronously operate.

Figure 4:
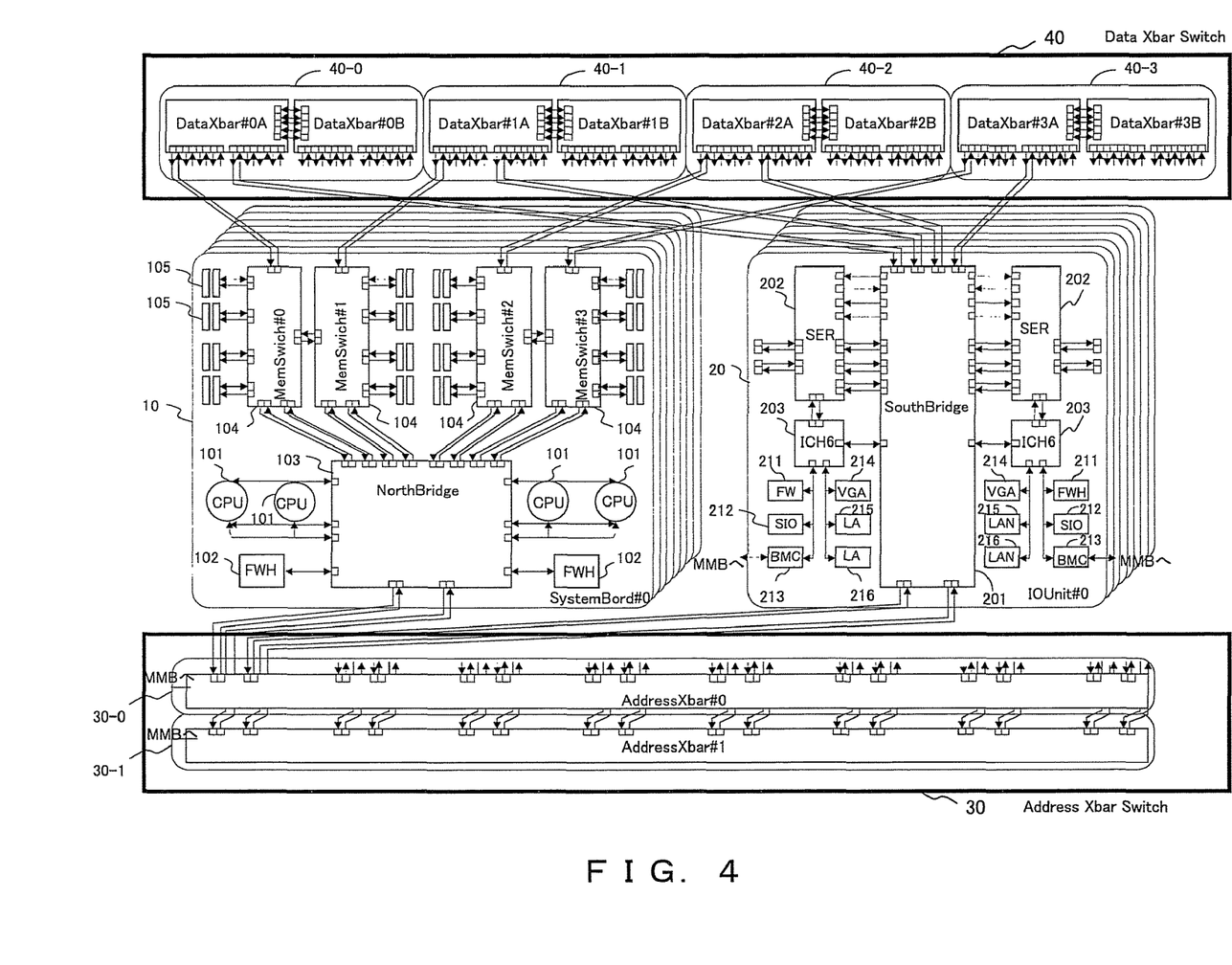
FIG. 4 is an explanatory view of an example of the detailed configuration of the data processing device according to the present embodiment.

FIG. 4 illustrates an example of the detailed configuration of the data processing device according to the present embodiment.

In the example illustrated in FIG. 4, the system board 10 is configured by four CPUs 101, two FWHs (firmware hubs) 102, a north bridge 103, four memory switches 104, and plurality of memory units 105 connected to each memory switch 104.

The north bridge 103 is loaded with control circuits such as a CPU interface, a memory interface, etc. Each memory switch 104 performs accessing the connected memory 105 or a data transfer through the data crossbars 40 depending on a request from the north bridge 103. The data obtained by the accessing the memory 105 or the data transfer through the data crossbars 40 is provided for the CPU 101 through the memory switch 104 and the north bridge 103. Each CPU 101 processes the thus provided data. The two FWHs 102 can be, for example, non-volatile memory.

The IO unit 20 includes a south bridge 201, two IO control chips ("SER" in FIG. 4) 202 connected to the south bridge 201, another IO control chip ("ICH6" in FIG. 4) 203 connected to each IO control chip 202, and controllers 211 through 216 connected to each IO control chip 203. The controller can be configured by connecting the FWH 211, the SIO (super IO) controller 212, the BMC (baseboard management controller) 213, the VGA (video graphics array) controller 214, and two LAN controllers 215 and 216 to the IO control chip 203. The controllers 211 through 216 are examples, and the types and number of controllers can be arbitrarily changed. The controller loaded into the IO unit 20 can be arbitrarily determined for each IO unit 20.

The BMC 213 communicates with a management board (MMB) for managing the entire data processing device. The FWH 211 is non-volatile memory storing, for example, BIOS. The SIO controller 212 supports a plurality of different standards. The IO control chip 203 is a general-purpose chip, and provides various interfaces. By providing various interfaces, the IO control chip 203 controls the FWH 211, the SIO controller 212, the VGA controller 214, the LAN controllers 215, and 216. The IO control chip 202 converts a signal for enabling signals to be transmitted and received between the south bridge 201 and the IO control chip 203. A storage device such as a hard disk device can be connected to the IO control chip 202, and one or more storage devices are practically connected to the IO control chip 202.

The south bridge 201 of the IO unit 20 is connected to two address crossbars 30 and four data crossbars 40. The south bridge 201 controls the controllers 211 through 216 connected to the IO control chip 203 through the IO control chips 202 and 203. When data acquired by any of the SIO controller 212 and the two LAN controllers 215 and 216 is transferred, the south bridge 201 issues an address request for data transfer, and outputs the address request to the address crossbars 30. When the data transferred from the system board 10 through the data crossbars 40 is received, the received data is transmitted to the controller to be transmitted through the IO control chips 202 and 203, and a corresponding controller is made to store, output, or transmit the data.

The four CPUs 101 on the system board 10 issue a read/write command to the memory 105, another system board 10, or the IO unit 20, and output the read/write command to the north bridge 103. The north bridge 103 temporarily stores the command inputted from each CPU 101, selects one of the command on the basis of the priority, issues the selected command as an address request, and outputs the address request to each of the address crossbars 30 and the four memory switches 104.

The data transferred to the system board 10 through the data crossbars 40 is received by the memory switch 104, outputted to the north bridge 103, and passed to the CPU 101 requiring the transfer data from the north bridge 103. The data to be transferred to another system board 10 or the IO unit 20 is transmitted and transferred by the memory switch 104 to the data crossbars 40.

In an element such as the memory, the buffer or queue for storing data and control information (hereinafter referred to totally as "data") implemented in the address crossbars 30, an ECC (error correcting code), a parity, etc., is added to the data. Thus, an occurrence of an uncorrectable error can be recognized. On the other hand, in detecting a transmission error between chips, aCRC (cyclicredundancy check) is normally performed in a serial transfer bus.

In the system board 10, a data transmission is performed between the memory switches 104, between the north bridge 103 and the memory switch 104, between the CPU 101 and the north bridge 103, etc. using a plurality of buses (signal lines (lanes)). In another IO unit 20, a data transmission is performed using a plurality of buses between the south bridge 201 and the IO control chip 202, between the IO control chips 202 and 203, etc. At least one of the elements connected to buses is a data processing device, and a data processing device according to the present embodiment is realized by loading the semiconductor device. Since it is not necessary to specifically limit the type for the semiconductor device according to the present embodiment, there is no practical reference to the type of the semiconductor device.

Figure 5:
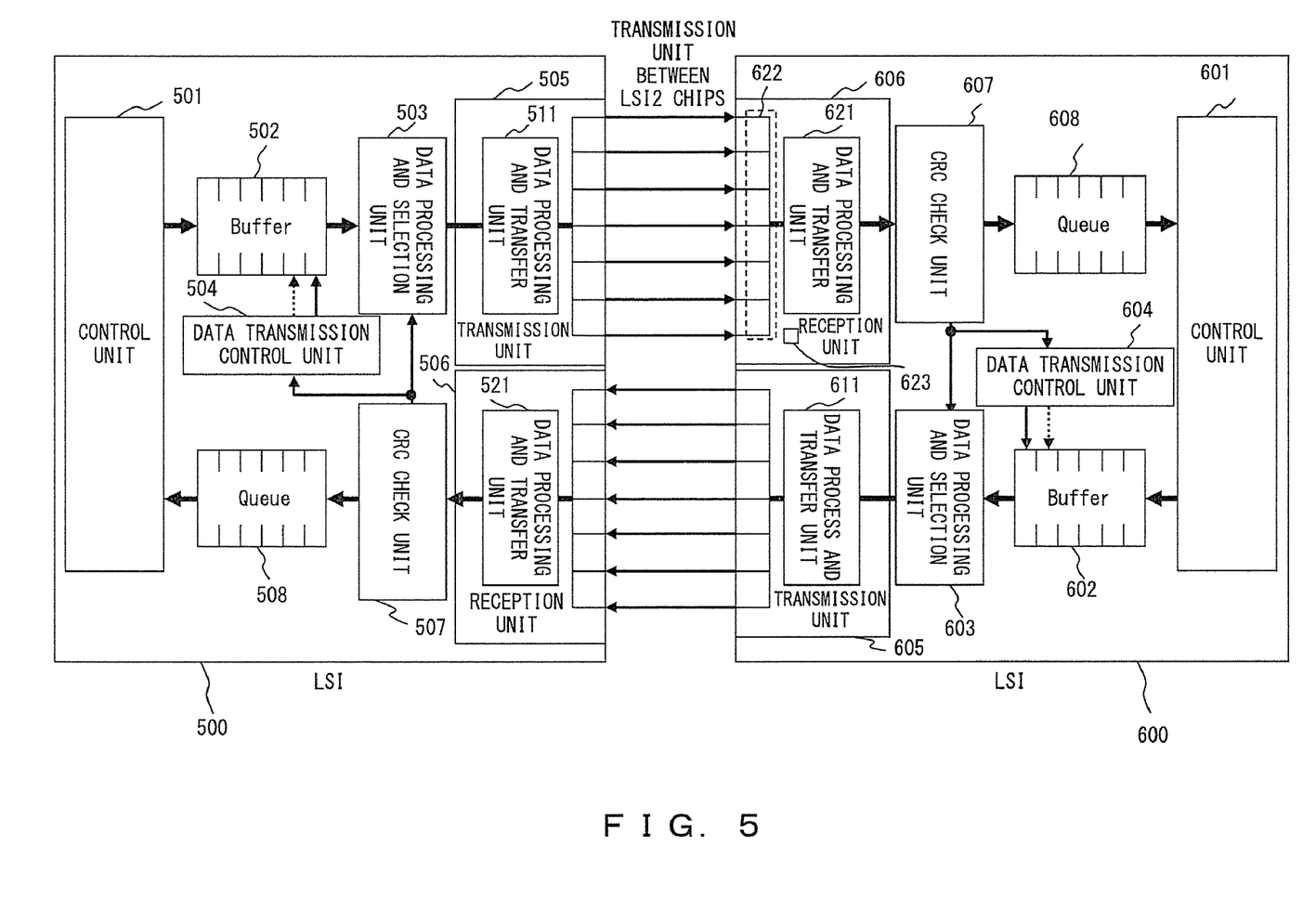
FIG. 5 illustrates the configuration of transmitting data as a semiconductor device according to the present embodiment.

FIG. 5 illustrates the configuration for a data transmission according to the present embodiment. In FIG. 5, it is assumed that a semiconductor device performs the data transmission.

A control unit 501 of the semiconductor device 500 stores the data to be transmitted to the semiconductor device 600 in a buffer 502. The data stored in the buffer 502 is selected by a data transmission control unit 504, outputted to a data processing and selection unit 503, and transmitted to a data processing and transfer unit 511 of a transmission unit 505. A data processing and transfer unit 511 adds a check code for an error check (CRC) to the data inputted from the data processing and selection unit 503, and transmits the data to a semiconductor device 600 through a transmission unit provided with a plurality of buses.

The data transmitted to the semiconductor device 600 is received by a data processing and transfer unit 621 of a reception unit 606, and transmitted to a CRC check unit 607. The CRC check unit 607 performs an error check by a CRC using the check code added to the received data, and confirms whether or not a transmission error has occurred. When the CRC check unit 607 confirmed that no transmission error has occurred, the semiconductor device 600 stores the data in a queue 608 as memory. The data stored in the queue 608 is read by a control unit 601.

A reception unit 506, a CRC check unit 507, and a queue 508 respectively corresponding to the reception unit 606, the CRC check unit 607, and the queue 608 of the semiconductor device 600 are provided for the semiconductor device 500. On the other hand, a buffer 602, a data processing and selection unit 603, a data transmission control unit 604, and a transmission unit 605 respectively corresponding to the buffer 502, the data processing and selection unit 503, the data transmission control unit 504, and the transmission unit 505 of the semiconductor device 500 are provided for the semiconductor device 600.

When the CRC check unit 607 of the semiconductor device 600 confirms that a transmission error has occurred by an error check, the occurrence of the error is reported to the data processing and selection unit 603. By the notification, the data processing and selection unit 603 requests the semiconductor device 500 to retransmit data through the data process and transfer unit 611. The data retransmission request is received and decoded by the reception unit 506 of the semiconductor device 500, and transmitted to the CRC check unit 507. The CRC check unit 507 notifies each of the data processing and selection unit 503 and the data transmission control unit 504 of the information that the data retransmission request has been received. As a result, the data on which a transmission error has occurred is read again from the buffer 502 by the data transmission control unit 504, and retransmitted to the semiconductor device 600 through the data processing and selection unit 503 and the transmission unit 505.

Figure 6:
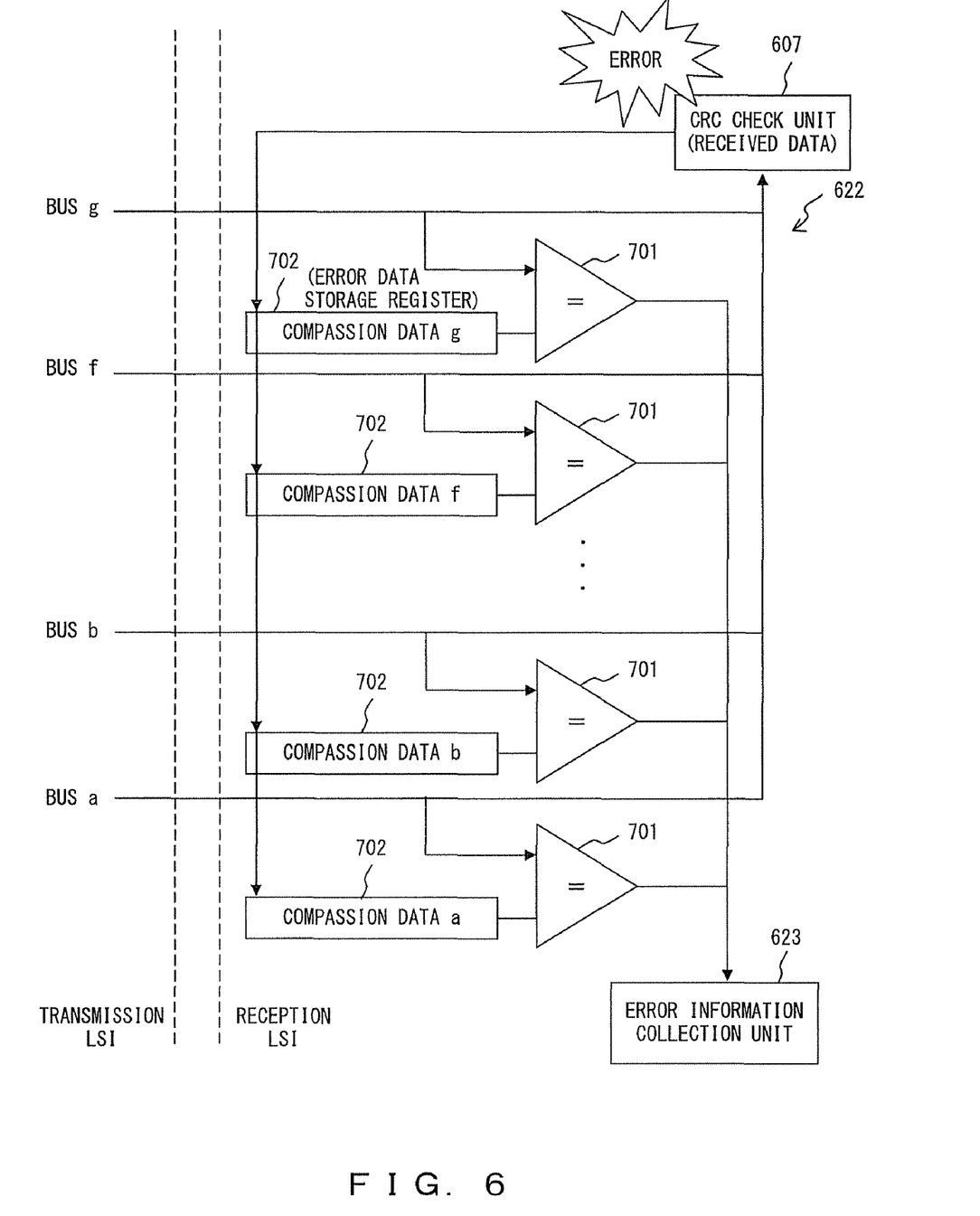
FIG. 6 illustrates the configuration of a data comparison unit.

A data comparison unit 622 is arranged before the data processing and transfer unit 621 for the reception unit 606 of the semiconductor device 600 as illustrated in FIG. 6. The data comparison unit 622 has a comparator 701 and an error data storage register 702 for each bus. The reception unit 606 is provided with the data comparison unit 622 and an error information collection unit 623 for collecting a comparison result outputted by each comparator 701 as error information. The characters "a", "b", "f", and "g" expressed in FIG. 6 are used not only to denote the respective buses, but also as symbols indicating the buses that received data.

Each comparator 701 compares the data transmitted on each of the corresponding bus with the data stored in the error data storage register 702, and outputs each comparison result as error information to the error information collection unit 623. The compared data is an amount of data on which an error check is performed by the CRC. The data is stored in the error data storage register 702 by the CRC check unit 607 that has confirmed the occurrence of an error on the received data as a result of the error check. At the time, the data stored in the error data storage register 702 is the data received when the error has occurred. The CRC check unit 607 stores the data received by the semiconductor device 600 when the error has occurred in the error data storage register 702 of the bus that has received the data. The received data at the occurrence of the error is compared with the data retransmitted from the semiconductor device 500 at the data source for each bus, when the received data is stored in the error data storage register 702.

Figure 7:
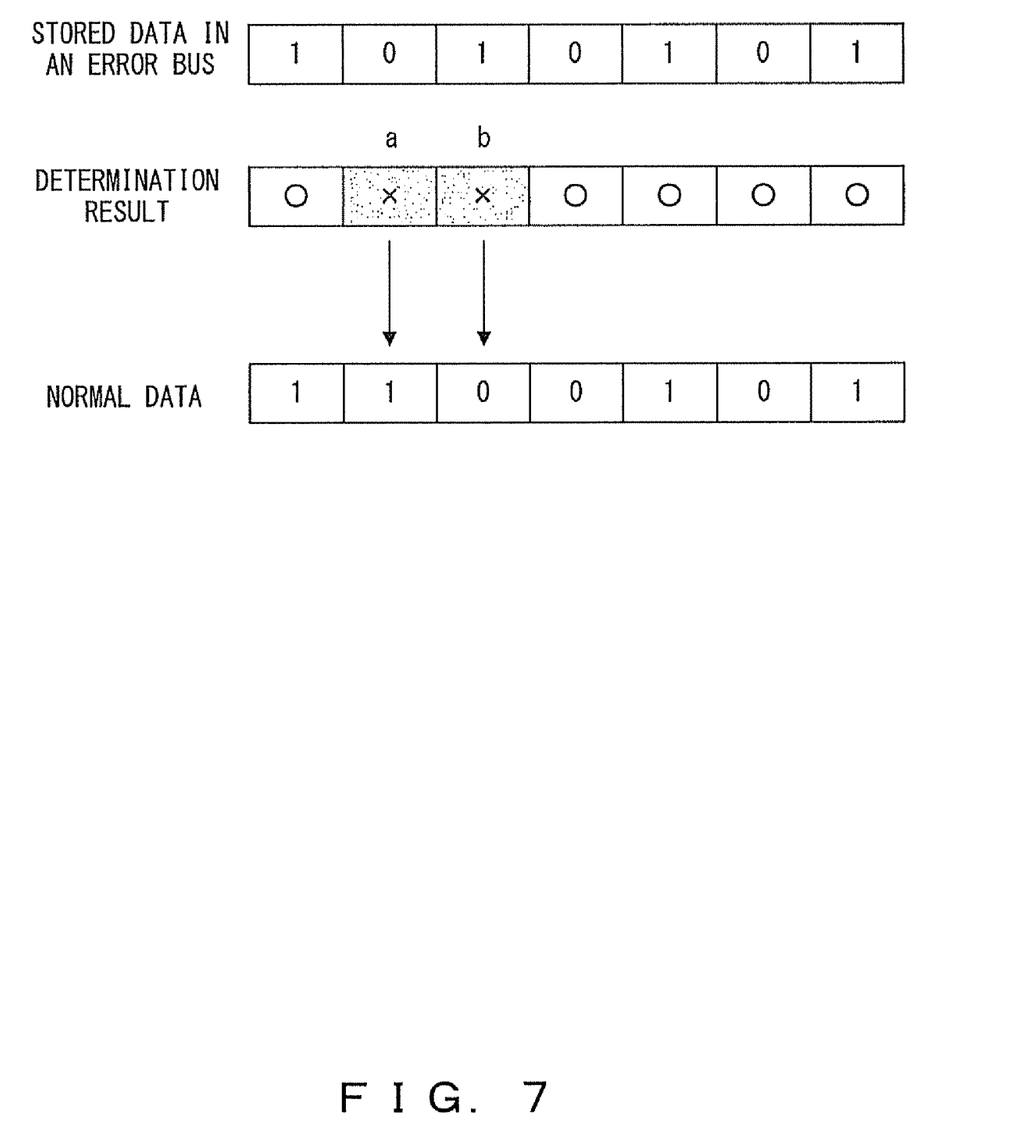
FIG. 7 is an explanatory view of the method of designating an error portion using a bus in which an error has occurred.

FIG. 7 is an explanatory view of the method of identifying an error portion in the bus where an error has occurred. The "stored data in an error bus" is data actually received by the bus in which an error has occurred, and the data is stored in the error data storage register 702. Each frame expressed by "1" or "0" indicates 1-bit data. Thus, FIG. 7 illustrates the data assigned a check code for an error check by the CRC as 7-bit data. The number of bits of the data assigned a check code is not necessarily seven bits.

The "normal data" illustrated in FIG. 7 indicates the original contents before the data error expressed as the "stored data in an error bus" has occurred. The "determination result" is the "stored data in an error bus" stored in the error data storage register 702, and a comparison result outputted bit by bit by the comparator 701 in the bus through which the "normal data" is retransmitted is expressed. In the comparison result, matching data is expressed by "o", and non-matching data is expressed by "x". The characters "a" and "b" expressed in the determination result as "x" indicate the positions (error portion) of the erroneous bits, and the arrows directed to the frames below from the frames assigned "a" and "b" indicate the erroneous bits in the "normal data", that is, the bits having values different from the values of the stored data in the error bus.

As described above, the comparator 701 compares bit by bit the data in which the error has been detected with the retransmission data in the bus in which an error has occurred, by storing the data in which the error has been detected in the error data storage register 702. The bit by bit comparison result by the comparator 701 is collected by the error information collection unit 623 as error information indicating an erroneous bit in the data. The error information collected by the error information collection unit 623 is stored or outputted when retransmission data in which no error is detected is received. By extracting such error information, the interference occurring by the data transferred in the adjacent bus and the level of the interference etc. can be analyzed.

The error information is stored or outputted by, for example, the CRC check unit 607. The error information can also be stored in a memory that is loaded into the CRC check unit 607. Otherwise, the information can also be stored in the control unit 601, or outputted to another semiconductor device by passing the information to the control unit 601 through the queue 608. In this example, it is assumed for convenience that the error information is stored in the memory in the CRC check unit 607.

Although not illustrated in FIG. 5, the data comparison unit and the error information collection unit as illustrated in FIG. 6 can be loaded into the reception unit 506 in the semiconductor device 500. When the data comparison unit and the error information collection unit are loaded into the semiconductor device 500, the data in which an error has been detected on the semiconductor device 600 is stored in each erroneous data storage register of the data comparison unit, the data in which the error has been detected is transmitted from the semiconductor device 600 to the semiconductor device 500, and the semiconductor device 500 compares the data, thereby identifying a bus in which an error has occurred. Thus, the element for detecting an error portion for each bus can be provided on both receiving side that has received the erroneous data and transmitting side that has transmitted the data.

Figure 8:
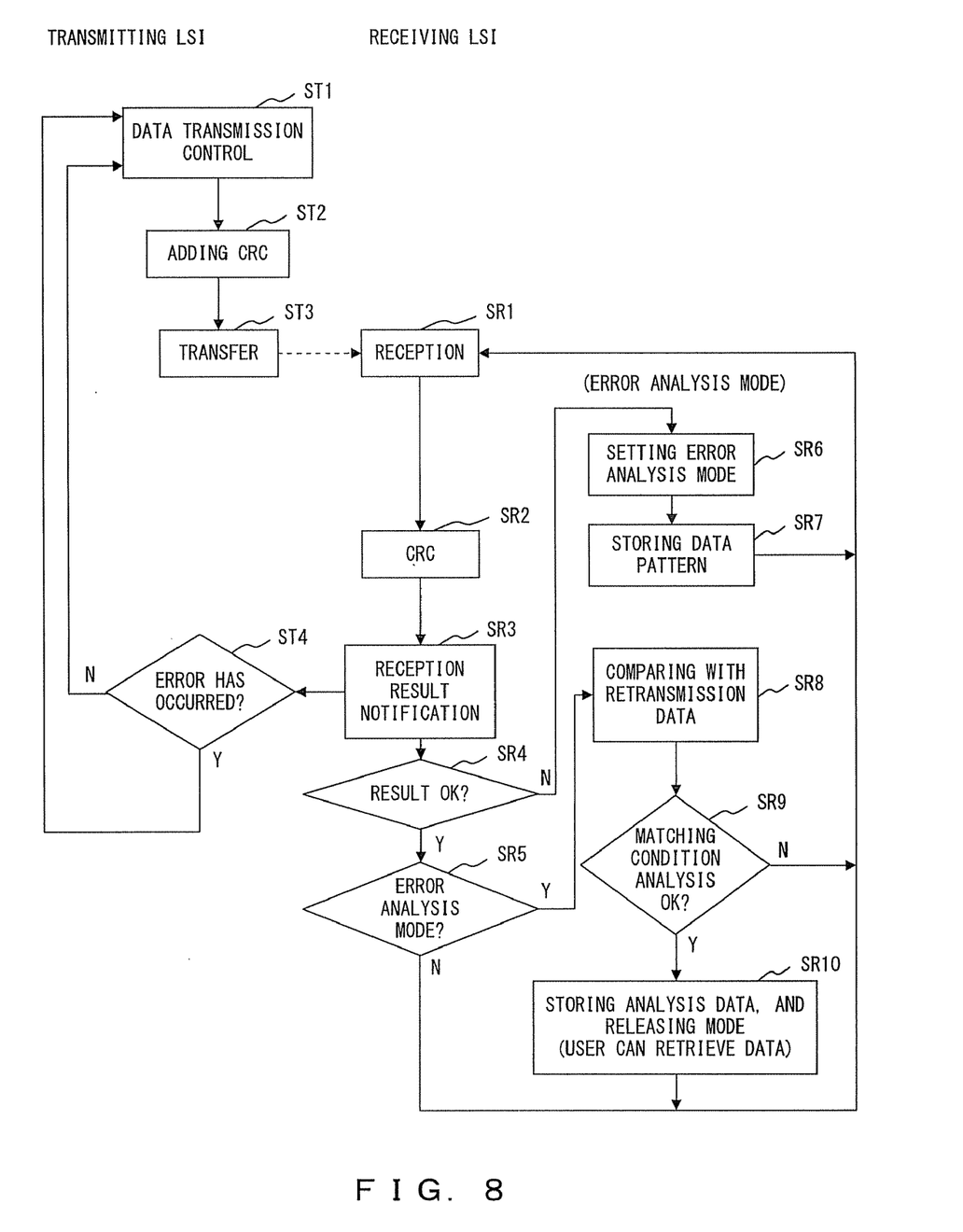
FIG. 8 is a flowchart illustrating the flow of the process of realizing a data transmission between semiconductor devices according to the present embodiment.

FIG. 8 is a flowchart illustrating the the process of a data transmission between semiconductor devices. FIG. 8 illustrates the processes performed on the transmitting device ("transmitting LSI" in FIG. 8) and the receiving device ("receiving LSI" in FIG. 8). In the receiving device, the process illustrated in FIG. 8 is performed by the CRC check unit mainly. In this example, it is assumed for convenience that the transmitting device is the semiconductor device 500, and the receiving device is the semiconductor device 600 in FIG. 8.

In the transmitting device 500, the data to be transmitted is selected by executing a data transmission control (ST1).

Then, a check code in the CRC system is added to the selected data (ST2), and data is transferred to the receiving device 600 (ST3).

On the other hand, in the receiving device 600, the reception unit 606 receives the transferred data (SR1), the CRC check unit 607 performs an error check of the received data by the CRC (SR2), and a check result is transmitted as a reception result to the transmitting device (SR3). A notification of the reception result is realized by the control by the CRC check unit 607.

Upon receipt of the reception result notification from the receiving device 600, the CRC check unit 507 of the transmitting device 500 decodes the reported reception result, and determines whether or not a transmission error has occurred during the data transfer performed in ST3 (ST4). When the CRC check unit 507 determines that the transmission error has occurred in the receiving device 600, the information is stored in the reception result notification received by the transmitting device 500. Therefore, the determination in ST4 is YES, and control is passed to ST1. In the data transmission controlling process, the data in which the transmission error has occurred is selected for retransmission (ST1). When the reception result notification from the receiving device 600 does not refer to the occurrence of the transmission error, the determination in ST4 is NO, and the data to be next transmitted is selected in the data transmission controlling process (ST1). The determination as to whether or not a transmission error has occurred or the selection of the data to be transmitted depending on the determination result is performed by, for example, the CRC check unit 607. Actually, data is selected through the data transmission control unit 604.

After the notification of the reception result, the receiving device 600 determines whether or not an error has occurred as a result of an error check by the CRC (SR4). When an error has been detected by the CRC, the determination in SR4 is NO. Therefore, the receiving device 600 sets an error analysis mode (SR6), and stores the received data in the error data storage register 702 for the bus in which an error has been detected (SR7) to prepare for the reception of retransmission data from the transmitting device 500 (SR7→SR1).

An error may continuously occur. For example, when the identification of the portion of an error that has first occurred is assigned the highest priority, the subsequent data is not stored in the error data storage register 702 when the second and subsequent errors occur, but the first data can be maintained in the error data storage register 702. Otherwise, each time an error occurs, the data to be stored in the error data storage register 702 can be rewritten.

On the other hand, when an error is not detected, the determination in SR4 is YES, and it is determined whether or not the error analysis mode is set (SR5). Since the error analysis mode is released by identifying the error portion of the bus in which the error has occurred, the determination in SR5 is NO if the identification for the bus in which the error has occurred is over, and the system is prepared for the reception of the next data (SR5→SR1). If the identification for the bus in which an error has occurred is not over, the determination in SR5 is YES. In this case, since the data received by the receiving device 600 can be retransmission data, the data comparison unit 622 of the receiving device 600 compares the data stored in the error data storage register 702 with the received data (SR8).

After the data comparison, the receiving device 600 analyzes the matching condition to determine as to whether or not the received data is retransmission data, and determines whether or not the analyzing result is OK (SR9). Although the receiving device 600 requests the transmitting device 500 to retransmit data, the data to be next received from the transmitting device 500 may not be the retransmission data. The matching condition is analyzed to confirm whether or not the received data is the retransmission data. The confirmation is performed practically by comparing bit by bit the data stored in SR7 with the received data, and determining whether or not the bit by bit matching rate is equal to or exceeding a predetermined value. If the matching condition analysis result is OK, that is, if the data matching rate for each bit is equal to or exceeds a predetermined value, then the determination in SR9 is YES, and the receiving device 600 stores a comparison result collected by the error information collection unit 623 as analysis data in the memory in the CRC check unit 607, releases the error analysis mode (SR10), thus preparing for the next data reception (SR10→SR1). On the other hand, if the result of the matching condition analysis is not OK, the determination in ST9 is NO, it is considered that the received data is not retransmission data, and the receiving device 600 is ready for the next data reception (SR9→SR1). The identification of an error portion in a bus in which an error has occurred is continuously performed.

The matching condition analysis in SR9 is not a process of limiting the present invention, but a process of more easily confirming retransmission data in the error analysis mode. If the information such as a code indicating retransmission data is added to the retransmission data, the code can be decoded. Other methods can be adopted.

Thus, in the present embodiment, the error portion of the bus in which an error has occurred is identified. The identification result of the bus in which an error has occurred can be used as the information for analysis of a bus in which an error has occurred and data (pattern) subject to an error, and supports more appropriate circuit design.

The identification of a bus in which an error has occurred cannot be performed until data without an error can be received. On the other hand, a transmission error can continuously occur. Therefore, the following method can be adopted to suppress the occurrence of a transmission error.

There is a possibility that an error can constantly occur in a specific bus as a result of the data transmitted through a bus having a bad influence on another bus. Thus, as illustrated in FIG. 9, it can be expressed that the probability of an occurrence of an error can be reduced by limiting the buses for use in retransmission or data. Therefore, if retransmission data is constantly erroneous after an error has occurred, the error can be more successfully avoided.

In FIG. 9, data 1 through 7 are transmitted through buses a through g in a normal operation. Only the bus g is drawn in a solid line because it is assumed in this example that only the bus g is used in a data transmission. In FIG. 9, the "error comparison register" corresponds to the error data storage register 702, and the error data storage register 702 storing received erroneous data is selected depending on the restriction of buses.

As illustrated in FIG. 9, when only one bus is used in a data retransmission, the occurrence of an error can be most effectively suppressed. However, the retransmission time required for the data retransmission gets longer. Thus, in the restriction of buses, there is the relationship of trade-off between the probability of the occurrence of an error and the retransmission time. Therefore, the restriction of buses by considering the retransmission time in addition to the suppression of the occurrence of an error is performed. Thus, it is preferable in many cases to use this mode as an error analysis mode.

The occurrence of an error can also be suppressed by not using adjacent buses for the transfer, that is, selecting buses located in an appropriately separate position. Thus, a user can arbitrarily set a bus configuration depending on the uses.

The determination as to whether or not buses are to be restricted is performed by, for example, a CRC check unit of the receiving device, and a bus restriction request is transmitted to a transmitting device through a data processing and selection unit 603 and a transmission unit. In the transmitting device, a bus restriction request is processed by, for example, the CRC check unit 607, and the restriction of buses is specified to the transmission unit through the data processing and selection unit. The restriction is realized by specifying a bus for use in a transmission. By the specification of the bus, the data process and transfer unit 611 of the transmission unit performs a data transmission using only a specified bus.

Figure 10:
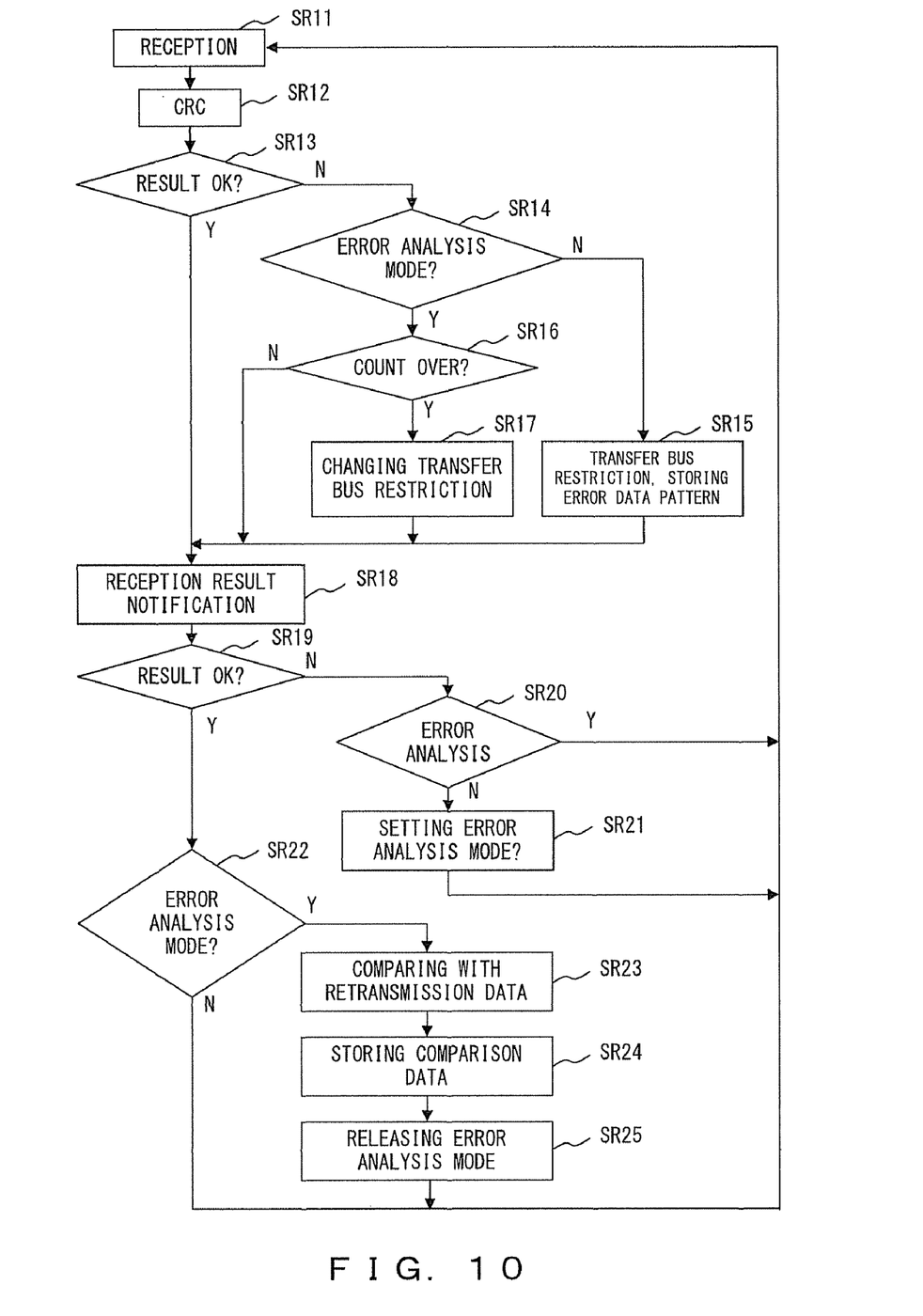
FIG. 10 is a flowchart of the slow of the process performed by a receiving device when buses used in a data transmission is limited.

When the restriction of buses for use in a data transmission is performed, the receiving device can perform the following process. FIG. 10 is a flowchart illustrating the flow of the process performed by the receiving device when the restriction of buses for use in a data transmission is performed. With reference to FIG. 10, the operation of the receiving device is described below in detail. For convenience, it is assumed that a data transmission is performed at a retransmission request after the detection of an error. As in FIG. 8, it is assumed that the receiving device is the semiconductor device 600, and the transmitting device is the semiconductor device 500.

The receiving device 600 receives data transferred from the transmitting device 500 (SR11), and an error check is performed by the CRC (SR12). Whether or not an error has been detected in the received data is determined as a result of the error check by the CRC (SR13). If no error has been detected in received data in any bus, then the determination in SR13 is YES, and the transmitting device 500 is notified of a check result as a reception result (SR18). The reception result notification by the receiving device 600 is realized by the control of the CRC check unit 607.

On the other hand, if an error has been detected in received data, the determination in SR13 is NO. Therefore, Whether or not the error analysis mode is set is determined (SR14). The error analysis mode is set after an error has been detected in received data, and is released when a portion in which the error has occurred in the received data is identified. If it is determined that the error analysis mode is not set in the process in SR14, that is, if an error has newly occurred and the error portion is to be identified, then the determination in SR14 is NO. In this case, the receiving device 600 restricts transfer buses for transmitting and receiving retransmission data, stores the received data in the error data storage register 702 according to the restriction of buses (SR15), and requests the transmitting device 500 to transmit data with the buses restricted with reference to the restriction of buses (SR18). At this time, the receiving device 600 notifies the transmitting device 500 of the designation of a transfer bus to be used or a transfer bus not to be used. On the other hand, if the error analysis mode is not set, the determination in SR14 is YES, and whether or not an over count has occurred is determined (SR16).

In the data transmission with the restriction of buses, the restriction of buses is changed on condition that an error has continuously occurs a predetermined number of times in the data transmission using the same bus. If an error has not occurred continuously a predetermined number of times in the data transmission using the same bus in SR16, then the determination in SR16 is NO, and the data retransmission is requested again to the transmitting device 500 (SR18). On the other hand, if an error has continuously occurred a predetermined number of times using the same bus, then the determination in SR16 is YES. In this case, the receiving device 600 changes the restriction of buses for transmission, stores the data in which an error has been detected in the error data storage register 702 of the bus used in a data transmission (SR17), and then a request to change the restriction of buses and retransmit data is issued to the transmitting device 500 (SR18).

When the buses for transfer of data are restricted, one or more buses transfer plural pieces of data. Therefore, if the data comparison unit 622 is used in comparing data bit by bit, the received data stored in the error data storage register 702 has to be rewritten each time data is received. Thus, when the buses are restricted, the data in the error data storage register 702 storing data to be rewritten can be rewritten each time a piece of data is received in SR11. The error information collection unit 623 collects error information for each piece of data in the bus through which plural pieces of data are transferred. Since the data in the error data storage register 702 is rewritten, the data stored in the error data storage register 702 in SR15 and SR17 is received data corresponding to the data first transmitted (retransmitted) in the bus containing the error data storage register 702. When the bit-by-bit comparison is performed not by hardware, data comparison unit 622 for instance, but by software, data is to be simply received in SR1 regardless of the restriction of buses. The CRC check unit 607 rewrites data in the error data storage register 702.

When an error is detected in received data as a result of an error check by the CRC after the reception result notification to the transmitting device 500 is completely made, the determination in SR9 is NO, and whether or not the error analysis mode is set is determined (SR20). If the error analysis mode is set, the determination in SR20 is YES, and the system is prepared for the reception of the next data (SR20→SR11). At this time, the error data storage register 702 stores received data corresponding to the data first transmitted (retransmitted) through the bus arranging the error data storage register 702. When the error analysis mode is not set, the determination in SR20 is NO, the receiving device 600 sets the error analysis mode (SR21), and then it is prepared for the reception of the next data (SR21→SR11). At the time of transfer to SR11, data is stored in the error data storage register 702 in SR15. Therefore, data is not stored in the error data storage register 702.

On the other hand, when an error is not detected in received data, the determination in SR19 is YES. Therefore, the receiving device 600 next determines whether or not the error analysis mode is set (SR22). If the error analysis mode is not set, the determination in SR20 is NO, and the receiving device 600 is prepared for the reception of the next data (SR22→SR11). When the error analysis mode is set, the determination in SR22 is YES, and the receiving device 600 next acquires bit-by-bit comparison results (error information) between data stored in the error data storage register 702 and the retransmission data for each piece of data from the error information collection unit 623 (SR23), stores the comparison result (SR24), releases the error analysis mode (SR25), and the receiving device 600 is prepared for the reception of the next data (SR25→SR11).

As described above, By comparing bit by bit for each signal line the data received when the error occurs with non-erroneous data, for example, retransmitted data, or correct data managed by the semiconductor device that transmitted the retransmitted data, the bit (timing) on which the error has actually occurred can be correctly designated in the data transmitted through the signal line in which the error has occurred.

In the above-mentioned error designating step, when the receiving device stores the data in which an error has occurred in the storing step, the data retransmission from the transmitting device after the occurrence of the error is performed by limiting the signal lines used in retransmitting data among a plurality of signal lines, the receiving device compares bit by bit the data retransmitted through the signal lines with the stored data, and a bit in which the error has occurred in the stored data can be designated. When this method is adopted, the cause of the error can be easily designated, and data can be transmitted by suppressing the interference among the signal lines. By suppressing the interference among the signal lines, the occurrence of an error can also be suppressed.

Therefore, according to an aspect of the present invention, a signal line through which an error occurs or an error easily occurs, and the contents of the error can be designated. Thus, detailed information for countering an error occurring during the data transmission using a plurality of signal lines (buses) can be obtained. As a result, the error can be more appropriately countered.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiment of the present inventions has been described in detail, it should be understood that the various changes, substitutions, and alterations could be made hereto without departing from the spirit and scope of the invention.

The invention claimed is:

1. An error identifying method of identifying an error occurring in a data transmission performed by using a plurality of signal lines, the error identifying method comprising:
    storing erroneous data when the error occurs during the data transmission performed by using the plurality of signal lines from a transmitting device to a receiving device;
    identifying an erroneous bit in the stored data by comparing bit by bit the data stored in the storing with non-erroneous data; and
    retransmitting the data, by using a signal line locating in a separate position from the signal line of the bit that the error was identified, to suppress the occurrence of a transmission error, wherein
    the signal line locating in a separate position is an identified signal line.

2. The error identifying method according to claim 1, wherein
    when the receiving device stores the data in which the error has occurred in the storing, in the identifying, the data retransmission from the transmitting device after the occurrence of the error is performed by limiting the signal lines used in retransmitting the data among the plurality of signal lines, the receiving device compares bit by bit the data retransmitted through the signal lines with the stored data, and a bit in which the error has occurred in the stored data can be identified.

3. A data processing device which performs a data transmission between semiconductor devices using a plurality of signal lines, the data process device comprising:
    an error determination device to determine whether or not an error has occurred in the data transmission from a transmitting device to a receiving device using the plurality of signal lines;
    a storage device to store data in which the error has occurred and which has been received by the receiving device when the error determination device determines that the error has occurred;
    an error identification device to identify an erroneous bit in the stored data by comparing bit by bit the data stored in the storage device with non-erroneous data; and
    a retransmitting device to retransmit the data, by using a signal line locating in a separate position from the signal line of the bit that the error was identified, to suppress the occurrence of a transmission error, wherein
    the signal line locating in a separate position is an identified signal line.

4. A semiconductor device which performs a data transmission with another semiconductor device by using a plurality of signal lines, the semiconductor device comprising:
    an error determination device to determine whether or not an error has occurred in data transmitted from the other semiconductor device by using the plurality of signal lines;
    a retransmission request device to request the other semiconductor device to retransmit the data when the error determination device determines that the error has occurred;
    an error identification device to identify an erroneous bit in received data by comparing bit by bit the retransmission data with received erroneous data when the error determination device determines that no error has occurred in the retransmission data received from the other semiconductor device at the retransmission request; and
    a retransmitting device to retransmit the data, by using a signal line locating in a separate position from the signal line of the bit that the error was identified, to suppress the occurrence of a transmission error, wherein
    the signal line locating in a separate position is an identified signal line.

5. The semiconductor device according to claim 4, wherein:
    the retransmission request device requests a restriction to limit signal lines used in a data transmission among the plurality of signal lines; and
    the error identification device compares bit by bit the retransmission data transmitted with the signal lines limited at the retransmission request with the receiving device.

6. The semiconductor device according to claim 4, wherein the retransmission request device repeatedly issues the retransmission request until no error is detected in the retransmission data.

7. A semiconductor device which performs a data transmission with another semiconductor device by using a plurality of signal lines, the semiconductor device comprising:
    a line selection device to select a signal line used in a data transmission from among the plurality of signal lines depending on a restriction request when the retransmission request for restricting the signal lines used in the data transmission in the plurality of signal lines is received from the other semiconductor device;
    a transmission device to perform the data transmission by using the signal lines selected by the line selection device; and
    a retransmitting device to retransmit the data, by using a signal line locating in a separate position from the signal line of the bit that the error was identified, to suppress the occurrence of a transmission error, wherein
    the signal line locating in a separate position is an identified signal line.

8. The error identifying method according to claim 1, wherein
   the identified signal line to use for retransmission is located in an appropriately separate position.

9. The data processing device according to claim 3, wherein
   the identified signal line to use for retransmission is located in an appropriately separate position.

10. The semiconductor device according to claim 4, wherein
    the identified signal line to use for retransmission is located in an appropriately separate position.

11. The semiconductor device according to claim 7, wherein
    the identified signal line to use for retransmission is located in an appropriately separate position.

* * * * *